(12) United States Patent
Meng

(10) Patent No.: US 10,186,677 B2
(45) Date of Patent: Jan. 22, 2019

(54) ELECTROLUMINESCENT DEVICE AND MANUFACTURING METHOD THEREOF AND DISPLAY DEVICE

(71) Applicant: BOE TECHNOLOGY GROUP CO., LTD., Beijing (CN)

(72) Inventor: Hu Meng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/539,764

(22) PCT Filed: Nov. 8, 2016

(86) PCT No.: PCT/CN2016/104968
§ 371 (c)(1),
(2) Date: Jun. 26, 2017

(87) PCT Pub. No.: WO2017/181654
PCT Pub. Date: Oct. 26, 2017

(65) Prior Publication Data
US 2018/0205030 A1   Jul. 19, 2018

(30) Foreign Application Priority Data
Apr. 20, 2016   (CN) .......................... 2016 1 0247744

(51) Int. Cl.
*H01L 51/00* (2006.01)
*H01L 51/50* (2006.01)

(52) U.S. Cl.
CPC .......... *H01L 51/5096* (2013.01); *H01L 51/50* (2013.01); *H01L 51/502* (2013.01);
(Continued)

(58) Field of Classification Search
None
See application file for complete search history.

(56) References Cited

U.S. PATENT DOCUMENTS

2007/0020483 A1* 1/2007 Park ...................... H01L 51/508
428/690
2009/0243469 A1* 10/2009 Horiba ................ H01L 51/0035
313/504

(Continued)

FOREIGN PATENT DOCUMENTS

CN   101556988 A   10/2009
CN   103730589 A   4/2014

(Continued)

OTHER PUBLICATIONS

Search Report and Written Opinion dated Feb. 6, 2017 from State Intellectual Property Office of the P.R. China.

(Continued)

*Primary Examiner* — Joseph Schoenholtz
(74) *Attorney, Agent, or Firm* — Dilworth & Barrese, LLP.; Michael J. Musella, Esq.

(57) ABSTRACT

An electroluminescent device and a manufacturing method thereof, and a display apparatus are provided. The electroluminescent device includes a base substrate; and an electron transport layer, disposed on the base substrate, the electron transport layer includes a first film layer for transporting electrons and a regulating structure arranged in contact with the first film layer, and the regulating structure is configured to regulate an electron mobility of the electron transport layer.

19 Claims, 1 Drawing Sheet

(52) U.S. Cl.
CPC ........ *H01L 51/508* (2013.01); *H01L 51/5076* (2013.01); *H01L 51/5084* (2013.01); *H01L 2251/303* (2013.01); *H01L 2251/5369* (2013.01); *H01L 2251/552* (2013.01); *H01L 2251/558* (2013.01)

(56) References Cited

U.S. PATENT DOCUMENTS

| | | | |
|---|---|---|---|
| 2012/0168737 A1* | 7/2012 | Tomono | C09K 11/06 257/40 |
| 2015/0069304 A1 | 3/2015 | Blouin et al. | |
| 2018/0076394 A1* | 3/2018 | Kawakami | H01L 51/0065 |

FOREIGN PATENT DOCUMENTS

| | | | |
|---|---|---|---|
| CN | 103762318 | A | 4/2014 |
| CN | 103824975 | A | 5/2014 |
| CN | 103904178 | A * | 7/2014 |
| CN | 104134754 | A | 11/2014 |
| CN | 105324460 | A | 2/2016 |
| CN | 105449112 | A | 3/2016 |
| CN | 105679958 | A | 6/2016 |
| CN | 205564819 | U | 9/2016 |
| WO | 2011141717 | A1 | 11/2011 |

OTHER PUBLICATIONS

First Chinese Office Action dated Mar. 1, 2017.
Second Chinese Office Action dated Jun. 21, 2017.
Yasuhiro Shirasaki, Geoffrey J. Supran, Moungi G. Bawendi and Vladimir Bulovic, Emergence of Colloidal Quantum-Dot Light-Emitting Technologies, Nature Photonics, vol. 7, Jan. 2013; pp. 13-23.

* cited by examiner

US 10,186,677 B2

ELECTROLUMINESCENT DEVICE AND MANUFACTURING METHOD THEREOF AND DISPLAY DEVICE

TECHNICAL FIELD

Embodiments of the present disclosure relate to an electroluminescent device and a manufacturing method thereof, and a display apparatus.

BACKGROUND

As a zero-dimensional nanomaterial, a quantum dot material has advantages of adjustable band gap, large specific area, excellent photoelectric property and the like. In recent years, the quantum dot material has gained wide attention in the fields such as light-emitting diodes, solar cells, light detectors, and display, etc. Particularly, in the field of display, the electroluminescent quantum dot device obtains higher luminous efficiency and is gradually developed in industrialization.

For the electroluminescent quantum dot device, by taking the quantum dot material with a core-shell structure, such as CdSe/ZnS, CdS/ZnS and the like as an example, a structure of the electroluminescent quantum device that is widely adopted at present is of anode/hole injection layer/hole transport layer/quantum dot light-emitting layer/electron transport layer/cathode.

SUMMARY

The disclosure provides an electroluminescent device and a manufacturing method thereof, and a display apparatus, so as to solve the problem that the material of the hole transport layer is limited when the electron mobility of the electron transport layer is different from the hole mobility of the hole transport layer.

At least one embodiment of the disclosure provides an electroluminescent device, comprising: a base substrate; and an electron transport layer, disposed on the base substrate, wherein the electron transport layer includes a first film layer for transporting electrons and a regulating structure arranged in contact with the first film layer, and the regulating structure is configured to regulate an electron mobility of the electron transport layer.

At least one embodiment of the disclosure provides a display apparatus comprising the electroluminescent device as mentioned above.

At least one embodiment of the disclosure provides a manufacturing method for an electroluminescent device, comprising: forming an electron transport layer on a base substrate, wherein the electron transport layer includes a first film layer for transporting electrons and a regulating structure arranged in contact with the first film layer, and the regulating structure is configured to regulate an electron mobility of the electron transport layer.

The above mentioned technical solutions of the disclosure have the following benefits: in the above mentioned technical solutions, the electron mobility of the electron transport layer of the electroluminescent device can be adjustable so as to be matched with the hole mobility of the hole transport layer, so that the selection on the material of the hole transport layer is not limited, the product cost is decreased while ensuing the luminescence efficiency of the device.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention. For those skilled in the art, other drawings can be obtained based on these drawings without inventive work.

DETAILED DESCRIPTION

Figure 1:
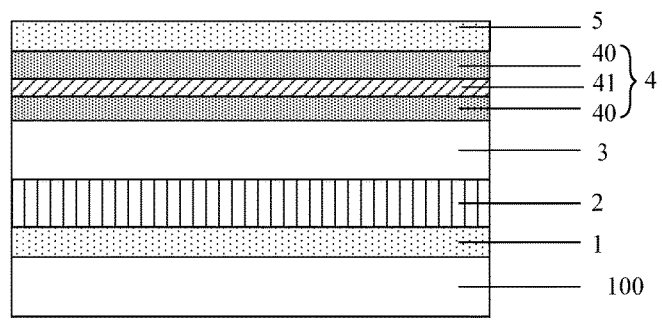
FIG. 1 is a structural schematic diagram of an electroluminescent device provided by an embodiment of the present disclosure.

In order to make objects, technical details and advantages of the embodiments of the disclosure apparent, the technical solutions of the embodiment will be described in a clearly and fully understandable way. It is obvious that the described embodiments are just a part but not all of the embodiments of the disclosure. Based on the described embodiments herein, those skilled in the art can obtain other embodiment(s), without any inventive work, which should be within the scope of the invention. In addition, the thickness and the shape of various layers in the drawings does not reflect the real scale necessarily, and it is only used to schematically illustrate the content of the disclosure.

Unless otherwise defined, the technical terms or scientific terms here should be of general meaning as understood by those ordinarily skilled in the art. In the present disclosure, words such as "first", "second" and the like do not denote any order, quantity, or importance, but rather are used for distinguishing different components. Words such as "include" or "comprise" and the like denote that elements or objects appearing before the words of "include" or "comprise" cover the elements or the objects enumerated after the words of "include" or "comprise" or equivalents thereof, not exclusive of other elements or objects. Words such as "connected" or "connecting" and the like are not limited to physical or mechanical connections, but may include electrical connection, either direct or indirect.

In research, an inventor of the present application notices that: in general electroluminescent devices, electron transport layers are manufactured by adopting inorganic materials such as zinc oxide (ZnO) quantum dots, for example, by a spin-coating method, and therefore, an electron mobility of the electron transport layer is much greater than that of the electron transport layer made of an organic material (or that of a hole transport layer) by about 2-3 orders of magnitudes. As a result, an electron current in the electroluminescent device is far more than a hole current. That is to say, in the electroluminescent device adopting the inorganic material such as the ZnO quantum dots as the electron transport layer, the electron mobility of the electron transport layer is much greater than that of the hole transport layer. Therefore, in one aspect, the hole transport layer must have a lower LUMO energy level, and an electron potential barrier at a hole transport layer/quantum dot layer interface enables surplus electrons to be limited at a quantum dot light-emitting layer; in another aspect, considering the problem of solvent miscibility, some specific materials must be selected for the hole transport layer, for example, Poly[N,N'-bis(4-butylphenyl)-N,N'-bis(phenyl)-benzi (short for poly-TBD), Poly[(9,9-dioctylfluorenyl-2,7-diyl)-co-(4,4'-(N-(4-sec-butylphenyl)diphenylamine)] (short for TFB), et., which also limits material selection of the hole transport layer.

The embodiments of the present disclosure provide an electroluminescent device and a manufacturing method thereof and a display apparatus. The electroluminescent device comprises: a base substrate, and an electron transport layer disposed on the base substrate; the electron transport layer includes a first film layer for transporting electrons and a regulating structure arranged in contact with the first film layer, and the regulating structure is used for regulating an electron mobility of the electron transport layer. The electroluminescent device regulates the electron mobility of the electron transport layer by the regulating structure, such that the electron transport layer is matched with the hole transport layer, so as to ensure a luminous efficiency of the electroluminescent device. In another aspect, more kinds of materials can be selected for the hole transport layer of the electroluminescent device, and the problem that the material of the hole transport layer is limited is solved, such that a cost of the electroluminescent device is reduced.

The electroluminescent device and the manufacturing method thereof and the display apparatus provided by the embodiments of the present disclosure are explained below in combination with drawings.

Embodiment I

The present embodiment provides an electroluminescent device, as illustrated in FIG. 1, comprising: a base substrate 100, and an electron transport layer 4 disposed on the base substrate 100; the electron transport layer 4 includes a first film layer 40 for transporting electrons and a regulating structure 41 arranged in contact with the first film layer 40, and the regulating structure 41 is used for regulating an electron mobility of the electron transport layer 4.

For example, as illustrated in FIG. 1, the electroluminescent device further comprises an anode 1, a hole transport layer 2, a light-emitting layer 3 and a cathode 5 which are disposed on the base substrate 100 in sequence. The electron transport layer 4 is located between the light-emitting layer 3 and the cathode 5. The light-emitting layer 3 can be made of electroluminescent materials such as a quantum dot material and an organic light-emitting material, and recombination of electrons and holes in the light-emitting layer 3 can excite the light-emitting layer 3 to emit light. It needs to be noted that in order to the improve the luminous efficiency, a hole injection layer (not illustrated) can be further disposed between the anode 1 and the hole transport layer 2, and an electron injection layer (not illustrated) is disposed between the electron transport layer 4 and the cathode 5.

In the electroluminescent device provided by the present embodiment, the electroluminescent device can regulate an electron mobility of the electron transport layer 4 by the regulating structure 41, such that the electron mobility of the electron transport layer 4 is adjustable. When transport rates of carriers (including electrons and holes) of the electron transport layer and the hole transport layer have large difference, the transport rates of the carriers of the electron transport layer 4 and the hole transport layer 2 can be matched through a regulating action of the regulating structure 41, and the luminous efficiency of the electroluminescent device can be ensured; in another aspect, because of the regulating structure 41 capable of regulating the electron transport layer 4, the electroluminescent device can further enable the material selection of the hole transport layer 2 to not be limited, such that a production cost is reduced. For example, when the first film layer of the electron transport layer is made of inorganic materials such as quantum dot inorganic materials (for example, the material of the first film layer can select ZnO quantum dots or ZnMgO quantum dots), and the electron mobility of the quantum dot material is much greater than a hole transport rate of the hole transport layer, as a result, an electron current is far more than a hole current, and therefore, the hole transport layer must have a lower LUMO energy level. An electron potential barrier at an interface between the light-emitting layer and the hole transport layer limits surplus electrons in the light-emitting layer to ensure the luminous efficiency. The electroluminescent device provided by the present embodiment can decrease the electron mobility of the electron transport layer by the regulating structure above, such that it is matched with the hole transport rate of the hole transport layer, and the problem of limitation to the material selection of the hole transport layer is overcome.

For example, in the electroluminescent device provided by an example of the present embodiment, a material of the regulating structure can be graphene oxide; since $sp^2$ hybridization in the graphene oxide is severely damaged, the graphene oxide basically loses conductivity; and because of the very low conductivity and electron mobility, the electron mobility of the whole electron transport layer is decreased to be matched with the hole transport rate of the electron transport layer. For example, the graphene oxide has the LUMO energy level which is 1.29 eV and thus has excellent electron blocking capacity. Of course, the material of the regulating structure is not limited to the graphene oxide, and can be other materials with poor conductivity and low electron mobility, which is not limited by the embodiment of the present disclosure.

For example, in the electroluminescent device provided by an example of the present embodiment, as illustrated in FIG. 1, the electron transport layer 4 includes a first film layer 40 for transporting electrons and a regulating structure arranged in contact with the first film layer 40. The regulating structure is a second film layer 41, arranged in contact with the first film layer 40 and is for regulating an electron mobility of the first film layer 40. That is to say, the electron transport layer 4 includes a first film layer 40 for transporting electrons and a second film layer 41 arranged in contact with the first film layer 40. The second film layer 41 is used for regulating an electron mobility of the electron transport layer 4 (through a reaction with the first film layer). It needs to be noted that the first film layer can be manufactured by adopting an organic material and can also be manufactured by adopting an inorganic material such as quantum dots. Therefore, by disposing the second film layer 41 arranged in contact with the first film layer 40, the electron mobility of the electron transport layer 4 is adjustable.

For example, the electron mobility of the second film layer 41 is greater than (or less than) that of the first film layer 40, to increase (or decrease) the electron mobility of a first transport layer, that is to say, the electron mobility of the electron transport layer 4 is increased (or decreased) by overlapping with the electron mobility of the first film layer. It should be noted that the material with very poor conductivity and very low electron mobility can be adopted as the regulating structure (the second film layer), so as to effectively decrease the electron mobility of the first film layer.

For example, in the electroluminescent device provided by an example of the present embodiment, a thickness of the second film layer 41 is 1-2 nm. Therefore, the second film layer can be manufactured by adopting the material with very poor conductivity and very low electron mobility. It should be explained that when the thickness of the second film layer 41 manufactured by adopting the material with very poor conductivity and very low electron mobility is 1-2 nm; since the thickness of the second film layer is very small, continuous regulation on the conductivity and the electron mobility of the electron transport layer can be realized by using adjustability of the a tunneling effect; and further, better carrier balance and device performances can be obtained. For example, the electron mobility of the electron transport layer can be changed by changing the thickness or potential barrier of the second film layer.

For example, the material of the second film layer can be graphene oxide. Therefore, in one aspect, the graphene oxide has the LUMO energy level of 1.29 eV only, and thus has excellent electron blocking capacity; in another aspect, because of a layered structure of the graphene oxide, a smaller thickness (1-2 nm) can be formed through a film forming process. For example, a plurality of extrathin graphene oxide layers (i.e., the second film layer) can be introduced into the electron transport layer, continuous regulation on the conductivity and the electron mobility of the electron transport layer can be realized by using adjustability of the a tunneling effect, and further, better carrier balance and device performances can be obtained.

Figure 2:
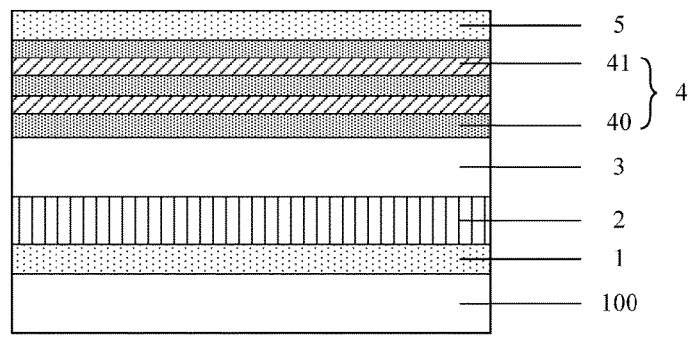
FIG. 2 is a structural schematic diagram of another electroluminescent device provided by an embodiment of the present disclosure.

For example, in the electroluminescent device provided by an example of the present embodiment, the electron transport layer 4 can include at least two first film layers 40, the second film layer 41 can be disposed between the two first film layers 40, such that continuous regulation on the electron mobility can be realized more efficiently, that is to say, the electron mobility of the electron transport layer can be regulated by setting the number of the second film layer sandwiched between the adjacent first film layers. For example, as illustrated in FIG. 1, the electron transport layer 4 can include two first film layers 40, and the second film layer is disposed between the two first film layers 40. Of course, the embodiment of the present disclosure includes but not limited thereto, and the electron transport layer can include more first film layers; for example, as illustrated in FIG. 2, the electron transport layer 4 can include three first film layers 40, and the second film layers 41 are disposed between every two adjacent first film layers 40.

Figure 3:
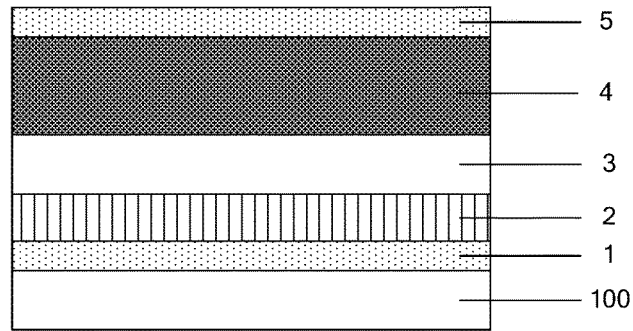
FIG. 3 is a structural schematic diagram of yet another electroluminescent device provided by an embodiment of the present disclosure.

For example, in the electroluminescent device provided by an example of the present embodiment, as illustrated in FIG. 3, the electron transport layer 4 includes the first film layer 40 for transporting electrons and a regulating structure arranged in contact with the first film layer 40. The regulating structure is formed by a regulator (not illustrated) doped into the first film layer, such that the electron mobility of the first film layer 41, i.e., the electron mobility of the electron transport layer 4 can be regulated. It needs to be noted that the regulator is a regulation material doped into the first film layer.

For example, a structure of the regulator doped into the first film layer 40 can be fine particles uniformly distributed in the first film layer 40. Of course, the embodiment of the present disclosure includes but not limited thereto, as long as the regulator doped into the first film layer can regulate (increase or decrease) the electron mobility of the electron transport layer.

For example, in the electroluminescent device provided by an example of the present embodiment, the electron mobility of the electron transport layer can be regulated by doping graphene oxide into the electron transport layer (i.e., the first film layer), that is to say, the regulator is graphene oxide. Since $sp^2$ hybridization in the graphene oxide is severely damaged, the graphene oxide basically loses conductivity; and because of the very low conductivity and electron mobility, the electron mobility of the whole electron transport layer is decreased to be matched with the hole transport rate of the electron transport layer. For example, the graphene oxide has the LUMO energy level which is 1.29 eV only and thus has excellent electron blocking capacity, the regulating structure is made of the graphene oxide doped into the electron transport layer, such that the conductivity and electron mobility of the electron transport layer can be decreased. It needs to be noted that continuous regulation on the conductivity and the electron mobility of the electron transport layer can be realized by doping the graphene oxide of different ratios, and further, better carrier balance and device performances can be obtained.

It needs to be noted that specific structures of the two regulating structures above can exist separately, that is, the regulating structure can be the second film layer or the regulator doped into the first film layer, so as to respectively regulate the electron mobility of the electron transport layer separately. Of course, the specific structures of the two specific regulating structures above can exist simultaneously, that is, the regulating structure includes the second film layer and the regulator doped into the first film layer, so as to regulate the electron mobility of the electron transport layer together.

For example, in the electroluminescent device provided by an example of the present embodiment, a material of the light-emitting layer includes quantum dots.

For example, in the electroluminescent device provided by an example of the present embodiment, as illustrated in FIG. 1, the electroluminescent device can be of a top emission type, a bottom emission type or a double-sided emission type. For example, when the electroluminescent device is the electroluminescent device of top emission type, light rays are emitted from the top of the electroluminescent device (the side where the cathode 5 is located); the anode 1 may be made of a reflective metal material, for example, silver and the like, and the cathode 5 may be made of a transparent conductive material, for example, ZnO, IGO, IZO, ITO or IGZO, etc. When the electroluminescent device is the electroluminescent device of bottom emission type, light rays are emitted from the bottom of the electroluminescent device (the side where the anode 1 is located); the anode 1 is made of a transparent conductive material, for example, ZnO, IGO, IZO, ITO or IGZO, etc., and the cathode 5 is made of a reflective metal material, for example, silver, etc., and the base substrate 100 is made of a transparent substrate, for example, a glass substrate or transparent resin substrate, etc. For example, when the electroluminescent device is the electroluminescent device of double-sided emission type, light rays are emitted from both the top of the device (the side where the cathode 5 is located) and the bottom of the device (the side where the anode 1 is located), part of the anode 1 and the cathode 5 is made of the transparent conductive material, and the other part is made of the reflective metal material, and the base substrate 100 can be a transparent substrate.

For example, in the electroluminescent device provided by an example of the present embodiment, the electroluminescent device further includes a packaging layer, which can prevent water and oxygen in the environment from influencing performance of the electroluminescent device.

For example, the packaging layer includes an inorganic insulating layer blocking the water and oxygen, for example, a silicon nitride layer, a silicon oxide layer, or a composite layer thereof.

Embodiment II

The present embodiment further provides a display apparatus, comprising the above electroluminescent device.

Since the above electroluminescent device overcomes the limitation to the material selection of the hole transport layer due to different carrier transport rates, performance of the device is ensured, and a production cost of the display apparatus is reduced.

For example, the display apparatus comprises a display substrate, and the electroluminescent device is formed on the base substrate of the display substrate, and realizes display by controlling the electroluminescent device to spontaneously emit light, for example, an organic light-emitting diode display apparatus.

Embodiment III

Based on the same inventive concept, the present embodiment provides a manufacturing method for the electroluminescent device as described in Embodiment I, which comprises: forming an electron transport layer on a base substrate. The forming an electron transport layer on a base substrate includes: forming a first film layer for transporting electrons on the base substrate; and forming a regulating structure arranged in contact with the first film layer, the regulating structure being used for regulating an electron mobility of the electron transport layer. Therefore, by regulating the electron transport layer of the electron transport layer through the regulating structure, the electron mobility of the electron transport layer is adjustable. When transport rates of carriers (including electrons and holes) of the electron transport layer and the hole transport layer have large difference, the transport rates of the carriers of the electron transport layer and the hole transport layer can be matched through the regulating structure, and the luminous efficiency of the electroluminescent device can be ensured; in another aspect, because of the regulating structure capable of regulating the electron transport layer, the electroluminescent device can further enable the material selection of the hole transport layer to not be limited, such that a production cost is reduced. Related description in Embodiment I can be referred to for details, which is not repeated by the embodiment of the present disclosure any more.

For example, the manufacturing method for an electroluminescent device provided by an example of the present embodiment further comprises: forming an anode, a hole transport layer, a light-emitting layer, an electron transport layer and a cathode on the base substrate in sequence. The electron transport layer is formed between the light-emitting layer and the cathode.

For example, the light-emitting layer can be manufactured by a quantum dot material, for example, core-shell structure quantum dots, such as CdSe/ZnS and CdS/ZnS, and can also be manufactured by an organic light-emitting material such as a fluorescent material and a phosphor material.

For example, the first film layer can be made of an organic material, and can also be made of an inorganic material such as quantum dots, for transporting electrons.

For example, the electron mobility of the regulating structure is greater than (or less than) that of the first film layer, to increase (or decrease) the electron mobility of the first film layer. The material with very poor conductivity and very low electron mobility can be adopted as the regulating structure, so as to effectively decrease the electron mobility of the first film layer.

For example, the manufacturing method for an electroluminescent device provided by an example of the present embodiment may further comprise: forming a hole injection layer between the anode and the hole transport layer, and forming an electron injection layer between the electron transport layer and the cathode, to improve the luminous efficiency of the electroluminescent device.

For example, in the manufacturing method for an electroluminescent device provided by an example of the present embodiment, the forming a regulating structure arranged in contact with the first film layer can include: forming a second film layer arranged in contact with the first film layer, the regulating structure including a second film layer. The second film layer forms the regulating structure.

For example, a thickness of the second film layer is 1-2 nm. When the regulating structure (the second film layer) is made of the material with very poor conductivity and very low electron mobility, since the thickness of the second film layer is very small, continuous regulation on the conductivity and the electron mobility of the electron transport layer can be realized by using adjustability of the a tunneling effect, and further, better carrier balance and device performances can be obtained.

For example, in the manufacturing method for an electroluminescent device provided by an example of the present embodiment, the electron transport layer includes at least two first film layers, and the manufacturing method can comprise: forming a second film layer between two adjacent first film layers to realize continuous regulation on the electron mobility more effectively.

For example, in the manufacturing method for an electroluminescent device provided by an example of the present embodiment, the forming a regulating structure arranged in contact with the first film layer can include: doping a regulator into the first film layer, the regulating structure including the regulator doped into the first film layer.

For example, the forming an electron transport layer can include: dissolving a conductive material to prepare a conductive solution, for forming the first film layer; dissolving the regulator to prepare a regulating solution; adding the regulating solution into the conductive solution according to a certain ratio to form a mixed solution; and using the mixed solution to form the electron transport layer.

For example, the regulating solution and the conductive solution can be mixed at a volume ratio of 1:1, 1:5, 1:10 and the like, and are uniformly mixed ultrasonically.

It needs to be noted that the two above specific embodiments for forming the regulating structure give two specific structure forms of the regulating structure formed in the electron transmission layer, and are convenient to realize technically, and a production cost can be reduced. In an actual application process, the structural form in which the regulating structure is formed in the electron transport layer is not limited to the above two forms, as long as the regulating structure is arranged in contact with the electron transport layer and can regulate the electron mobility of the first film layer.

For example, in the manufacturing method for an electroluminescent device provided by an example of the present embodiment, when the first film layer of the electron transport layer is made of inorganic materials such as quantum dots (for example, ZnO quantum dots and ZnMgO quantum dots), the regulating structure is formed by using graphene oxide, and the graphene oxide has very low conductivity and electron mobility, such that the electron mobility of the first film layer can be decreased to be matched with a hole transport rate of the hole transport layer.

For example, when the graphene oxide is adopted to form the regulating structure, the manufacturing method can further comprise: preparing a graphene oxide solution. Therefore, when the regulating structure is made of the graphene oxide doped into the first film layer, the graphene oxide solution can be added to the conductive solution for preparing the first film layer according to a certain ratio to form a mixed solution, and the mixed solution is used to form the electron transport layer; when the regulating structure is formed by the graphene oxide layer arranged in contact with the first film layer, the graphene oxide layer can be formed on the first film layer through a film-forming process such as spin-coating, and the electron transport layer can be formed by the first film layer and the graphene oxide layer which are laminated. The graphene oxide is a single atom layer, and thus can be extended to dozens of micrometers in a transverse direction anytime, which is favorable for formation of an ultrathin film layer, and a thickness of the formed graphene oxide layer can be 1-2 nm. For example, the graphene oxide layer can be formed between the two adjacent first film layers, and continuous regulation on the conductivity and the electron mobility of the electron transport layer can be realized by using adjustability of the a tunneling effect.

For example, preparing the graphene oxide solution can include: in a low temperature environment, for example, an environment with a temperature lower than 200 Celsius degree, mixing graphite powder, sodium nitrate and concentrated sulfuric acid; adding a catalyst; after reaction is finished, separating graphite oxide out; and using the graphite oxide to prepare the graphene oxide solution. It needs to be noted that the low temperature environment in the preparing method above can be provided by ice water bath, that is, a container where the graphite powder, sodium nitrate and concentrated sulfuric acid are mixed is placed in ice water. The used catalyst can be potassium permanganate, after reaction is finished, hydrogen peroxide is added to reduce the residual potassium permanganate into manganese dioxide; and the graphite oxide is separated out after filtering and washing for many times. Then the graphite oxide can be dispersed and crushed by using an ultrasonic cavitation effect in a liquid phase system to prepare the graphene oxide solution. The liquid phase system can be water because the graphene oxide has excellent dispersibility in water.

After the graphene oxide solution and the conductive solution are prepared, the graphene oxide solution and the conductive solution are mixed at a volume ratio of 1:1, 1:5 and 1:10 and are uniformly mixed ultrasonically to form a mixed solution, and the mixed solution is used to form the electron transport layer. Or the conductive solution is used to form the first film layer, the graphene oxide solution is used to form a graphene oxide layer arranged in contact with the first film layer, and the electron transport layer can be formed by the first film layer and the graphene oxide layer which are laminated. For example, the graphene oxide layer is formed by the two adjacent first film layers, and a thickness of the graphene oxide layer is 1-2 nm.

For example, the manufacturing method for an electroluminescent device provided by an example of the present embodiment further comprises: washing a base substrate with acetone, alcohol and deionized water in sequence, and irradiating with UV rays for 10 mins; forming an anode 1 on the base substrate 100; forming a hole injection layer (not illustrated) on the anode 1; for example, a thickness of the hole injection layer can be about 40 nm; for another example, a material for manufacturing the hole injection layer can be prepared by dissolving a polymer of 3,4-ethylenedioxythiophene monomer and polystyrolsulfon acid salt into water, a mixture of the polymer of 3,4-ethylenedioxythiophene monomer and polystyrolsulfon acid salt greatly improves solubleness of the polymer of 3,4-ethylenedioxythiophene monomer, and conductivity is very high; forming a hole transport layer 2 and a light-emitting layer 3 on the hole injection layer in sequence and drying; forming an electron transport layer 4 on the light-emitting layer 3, wherein the electron transport layer includes a first film layer for transporting electrons and a regulating structure arranged in contact with the first film layer, and the regulating structure is used for regulating an electron mobility of the first film layer; and forming an electron injection layer (not illustrated) and a cathode 5 on the electron transport layer 4 in sequence. So far, the manufacturing of the electroluminescent device is finished.

The technical solution of the present disclosure is particularly suitable for the first film layer that is made of the inorganic materials such as quantum dots because the electron mobility of the quantum dot material is much greater than a hole transport rate of the hole transport layer, as a result, an electron current is far more than a hole current. Therefore, the hole transport layer must have a low LUMO energy level, such that an electron potential barrier at an interface between the light-emitting layer and the hole transport layer enables surplus electrons to be limited into the light-emitting layer and luminous efficiency is ensured. The present disclosure decreases the electron mobility of the first film layer through the above regulating structure, such that the electron mobility is matched with the hole transport rate of the hole transport layer, and the problem of the limitation to the material selection of the hole transport layer is overcome.

The foregoing is only the preferred embodiments of the present invention and not intended to limit the scope of protection of the present invention. Any change or replacement that may be easily thought of by those skilled in the art within the technical scope disclosed by the present invention shall fall within the scope of protection of the present invention. Therefore, the scope of protection of the present invention shall be defined by the appended claims.

The application claims priority to the Chinese patent application No. 201610247744.2, filed Apr. 20, 2016, the entire disclosure of which is incorporated herein by reference as part of the present application.

The invention claimed is:

1. An electroluminescent device, comprising:
 a base substrate; and
 an electron transport layer, disposed on the base substrate, wherein the electron transport layer includes a first film layer for transporting electrons and a regulating structure arranged in contact with the first film layer, and the regulating structure is configured to regulate an electron mobility of the electron transport layer, and a material of the regulating structure includes graphene oxide.

2. The electroluminescent device according to claim 1, wherein the regulating structure includes:
 a second film layer, arranged in contact with the first film layer;
 wherein the second film layer has an electron mobility less than that of the first film layer.

3. The electroluminescent device according to claim 2, wherein the electron transport layer includes at least two first film layers, and the second film layer is disposed between the two first film layers.

4. The electroluminescent device according to claim 2, wherein the second film layer has a thickness of 1-2 nm.

5. The electroluminescent device according to claim 1, wherein a material of the second film layer includes graphene oxide.

6. The electroluminescent device according to claim 1, wherein the regulating structure includes a regulator doped in the first film layer.

7. The electroluminescent device according to claim 6, wherein a material of the regulator includes graphene oxide.

8. The electroluminescent device according to claim 1, wherein a material of the first film layer includes an inorganic material.

9. The electroluminescent device according to claim 7, wherein a material of the first film layer includes zinc oxide (ZnO) quantum dots or magnesium zinc oxide (ZnMgO) quantum dots.

10. The electroluminescent device according to claim 1, further comprising:
   an anode disposed on the base substrate;
   a hole transport layer disposed on the anode;
   a light-emitting layer disposed on the hole transport layer; and
   a cathode disposed on the electron transport layer,
   wherein the electron transport layer is located between the light-emitting layer and the cathode.

11. The electroluminescent device according to claim 10, wherein a material of the light-emitting layer includes quantum dots.

12. A display apparatus, comprising the electroluminescent device according to claim 1.

13. A manufacturing method for an electroluminescent device, comprising:
   forming an electron transport layer on a base substrate,
   wherein the electron transport layer includes a first film layer for transporting electrons and a regulating structure arranged in contact with the first film layer, and the regulating structure is configured to regulate an electron mobility of the electron transport layer, and the regulating structure is formed by using graphene oxide.

14. The manufacturing method according to claim 13, further comprising:
   forming a second film layer in contact with the first film layer, wherein the regulating structure includes the second film layer.

15. The manufacturing method according to claim 14, wherein the electron transport layer includes at least two first film layers, the manufacturing method comprising:
   forming the second film layer between two adjacent first film layers.

16. The manufacturing method according to claim 13, further comprising:
   doping a regulator into the first film layer, wherein the regulating structure includes the regulator doped into the first film layer.

17. The manufacturing method according to claim 16, further comprising:
   dissolving a conductive material to prepare a conductive solution, for forming the first film layer;
   dissolving the regulator to prepare a regulating solution;
   adding the regulating solution into the conductive solution to form a mixed solution; and
   using the mixed solution to form the electron transport layer.

18. The manufacturing method according to claim 13, further comprising:
   mixing graphite powder, sodium nitrate and concentrated sulfuric acid;
   adding a catalyst;
   separating graphite oxide out after reaction is finished; and
   using the graphite oxide to prepare a graphene oxide solution and adding the graphene oxide solution into the conductive solution to form the mixed solution.

19. The manufacturing method according to claim 18, wherein the catalyst is potassium permanganate, and after the reaction is finished, hydrogen peroxide is added to reduce the residual potassium permanganate into manganese dioxide; and the graphite oxide is separated out after filtering and washing for many times.

\* \* \* \* \*